(12) United States Patent
Archer

(10) Patent No.: US 6,605,979 B1
(45) Date of Patent: Aug. 12, 2003

(54) TRIM BIT CIRCUIT FOR BAND-GAP REFERENCE

(75) Inventor: Donald M. Archer, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/946,661

(22) Filed: Sep. 5, 2001

Related U.S. Application Data

(60) Provisional application No. 60/265,570, filed on Jan. 31, 2001.

(51) Int. Cl.$^7$ ............................................. H01H 37/76
(52) U.S. Cl. ........................ 327/525; 327/202; 327/333
(58) Field of Search ................................. 327/333, 525, 327/526, 18, 202, 203; 365/185.01, 185.18, 185.21

(56) References Cited

U.S. PATENT DOCUMENTS 6,240,027 B1 * 5/2001 Lee et al. ...................... 326/80
6,333,662 B1 * 12/2001 Umezawa et al. ............. 326/80

* cited by examiner

*Primary Examiner*—Terry D. Cunningham
*Assistant Examiner*—Quan Tra
(74) *Attorney, Agent, or Firm*—Stallman & Pollock LLP

(57) ABSTRACT

A trim bit circuit is provided that uses a cascoded differential PMOS EPROM with a fixed offset cross-coupled latch. The output sense signal is transferred by transmission gates to NMOS latched inverters. The output is buffered by another inventor. Programming is performed by a NMOS current sink that pulls the drain of the programmed (trimmed) PMOS EPROM device to ground. This places the full positive supply across the short channel trimmed device, the punchthrough inducing a trapped charge on the device. The reference (untrimmed) PMOS EPROM device is uncharged. Thus, the two PMOS EPROM transistors have unequal current. During the read mode, a replication bias voltage is induced by an external "read" power-on-reset circuit, thereby placing a few volts below positive supply on the gates of the cascode devices. This allows the Vds of the PMOS EPROM devices to increase to a little less than a volt. Since the trimmed transistor has more current than the un-trimmed transistor by a few decades of current, the drain of the load latch transistor rises to a voltage limited by the saturation voltage of the EPROM devices, causing the output of the load latch device to be high.

6 Claims, 5 Drawing Sheets

TRIM BIT CIRCUIT FOR BAND-GAP REFERENCE

RELATED APPLICATION

This non-provisional patent application claims priority from U.S. Provisional Patent Application No. 60/265,570, filed Jan. 31, 2001, titled "Trim Bit Circuit for Band-Gap Reference", which provisional application is hereby incorporated by reference in its entirety.

BACKGROUND OF THE INVENTION

1. Field of the Invention

The present invention relates generally to semiconductor integrated circuits and, in particular, to trim bit circuits utilizable for trimming a band-gap reference circuit to ideal voltage.

2. Discussion of the Related Art

The band-gap reference circuit has been a popular analog integrated circuit for many years. It is used in conventional junction-isolated bipolar integrated circuit technology to provide a stable low-voltage reference. Band-gap circuits are also used in digital integrated circuits to provide a local bias that is not adversely affected by ambient noise or transients.

Operationally, band-gap reference circuits rely on the summation of a first voltage term that decreases at the rate of about −2 millivolts/° C. and a second voltage that increases at about +2 millivolts/° C., thereby resulting in an overall temperature coefficient (tempco) for the circuit that is substantially zero.

All band-gap circuits utilize this summation of a growing voltage and a shrinking voltage to generate a stable, low-tempco reference voltage. It has also been shown that, when a band-gap circuit has been trimmed to the correct voltage, the correct tempco will follow, despite process variations in parameters such as $V_{be}$, beta, sheet resistivity, etc. consequently, band-gap circuits are often trimmed to their ideal voltage to provide a low tempco.

SUMMARY OF THE INVENTION

The present invention provides a trim bit circuit that uses a cascoded differential PMOS EPROM with a fixed offset cross-coupled latch. The output sense signal is transferred by transmission gates to NMOS latched inverters. The output is buffered by a third inverter. Programming is performed by an NMOS current sink that pulls the drain of the programmed (trimmed) PMOS EPROM device to ground. This places the full positive supply across the short channel trimmed device, the punchthrough inducing a trapped charge on the device. The reference (untrimmed) PMOS EPROM device is uncharged. Thus, the two PMOS EPROM transistors have unequal current. During the read mode, a replication bias voltage is induced by an external "read" power-on-reset circuit, thereby placing a few volts below positive supply on the gates of the cascode devices. This allows the Vds of the PMOS EPROM devices to increase to a little less than a volt. Since the trimmed transistor has more current than the untrimmed transistor by a few decades of current, the drain of the load latch transistor rises to a voltage limited by the saturation voltage of the EPROM devices, causing the output of the load latch device to be high.

Further features and advantages of the present invention will become apparent from the following detailed description and accompanying drawings, which set forth an illustrative embodiment in which the principles of the invention are utilized.

DETAILED DESCRIPTION OF THE INVENTION

Figure 1:
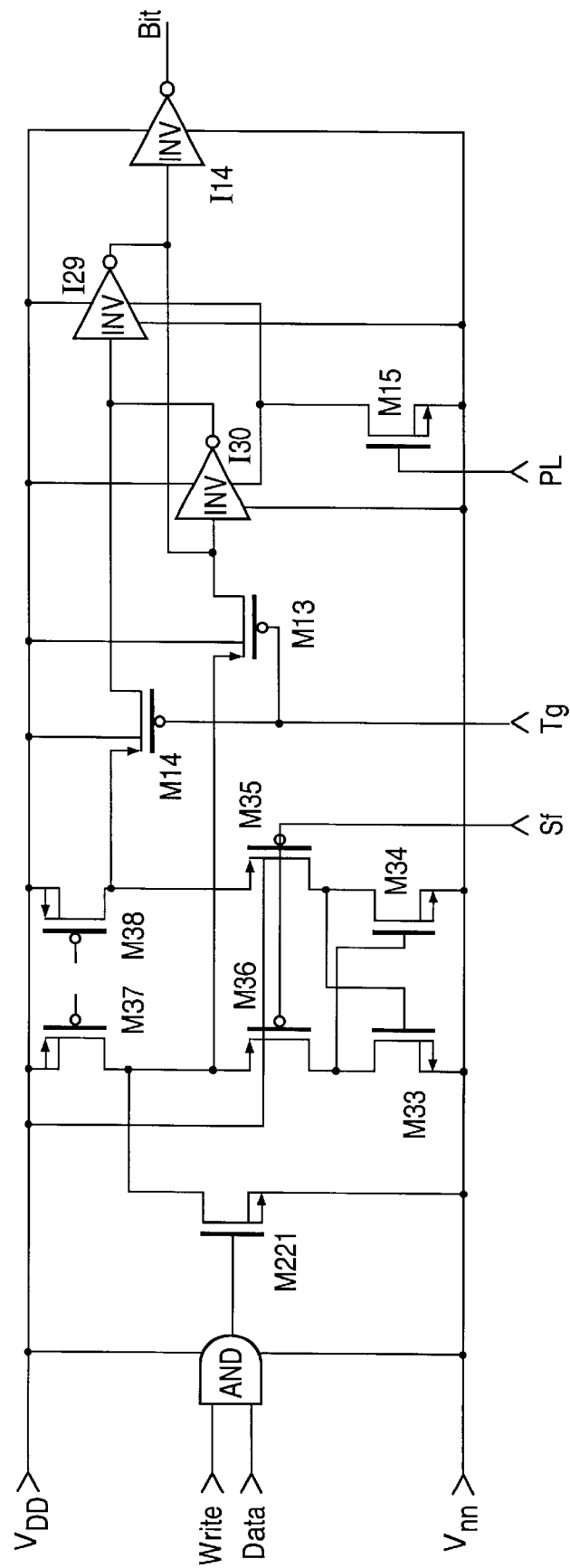
FIG. 1 is a schematic diagram illustrating an embodiment of trim bit circuit in accordance with the present invention.

Referring to FIG. 1, a trim bit circuit in accordance with a first embodiment of the present invention uses a cascoded (devices M35/M36) differential PMOS EPROM cell (devices M37/M38) with a fixed offset cross-coupled NMOS latch (devices M33/M34). The differential output sense signal is transferred via PMOS transmission gates (devices M13/M14) to corresponding NMOS latched (device M15) inverters (I29/I30). The trim bit output signal (Bit) is buffered by another inverter (I14).

Figure 2:
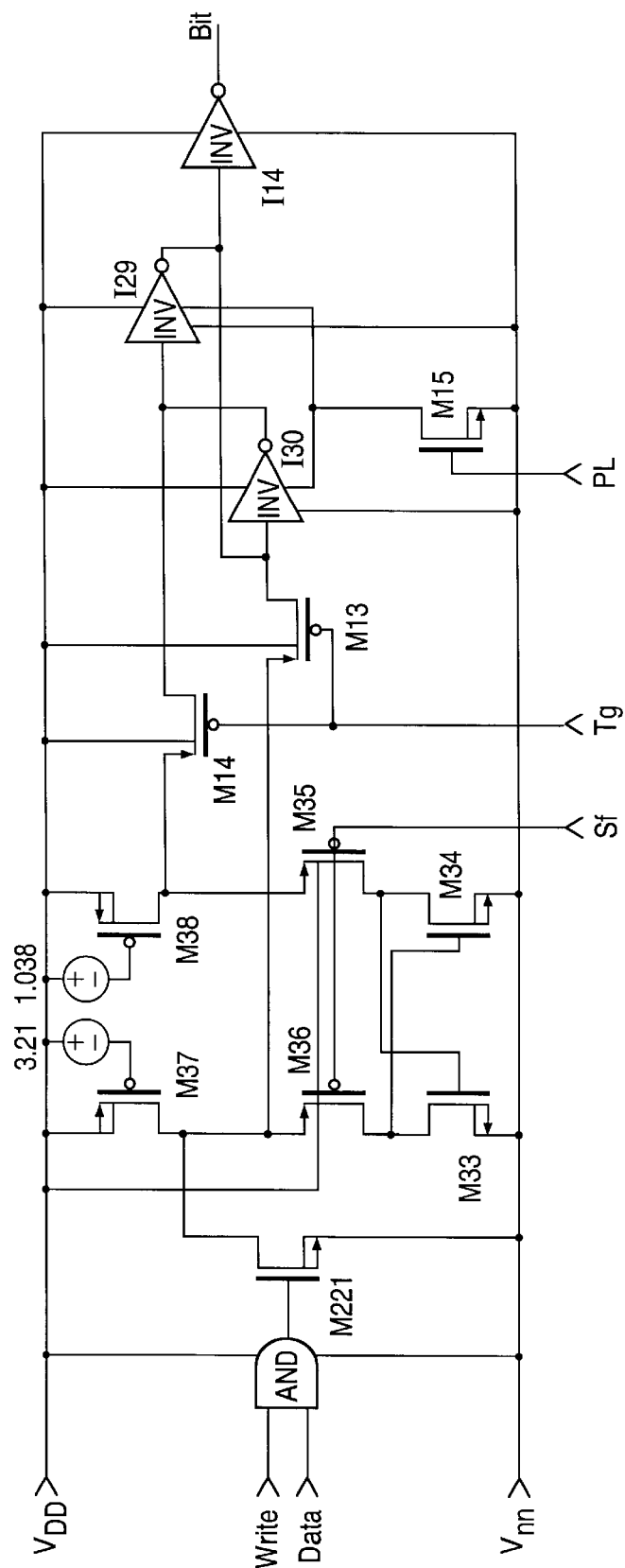
FIG. 2 is a schematic diagram illustrating the FIG. 1 circuit in an "trimmed" state.

Referring to FIG. 2, programming is performed by a NMOS current sink (device M221) pulling the drain of the PMOS EPROM device (M37) to ground. This places the full VDD supply across the short channel PMOS EPROM device (M37). The punchthrough induces a trapped charge on the programmed (trimmed) PMOS EPROM device (M37). The reference (untrimmed) PMOS EPROM device (M38) is unchanged. The two PMOS EPROM transistors (M37/M38) have unequal current by a few decades of current.

During the read mode, a replication bias voltage (Sf) is induced by an external "read" power-on-reset circuit. This places a bias of a few volts below VDD supply on the gate of the cascode PMOS devices (M35/M36). This allows the Vds of the PMOS EPROM transistors (M37/M38) transistors to increase to a little less than a volt. Since trimmed PMOS EPROM transistor (M37) has more current than the un-trimmed PMOS EPROM transistor (M38) by a few decades of current, the drain of the load latch transistor (M33) rises to a voltage limited by Vds sat of the cascode devices (M36/M37). The output of the latch device (M33) will be high.

Figure 3:
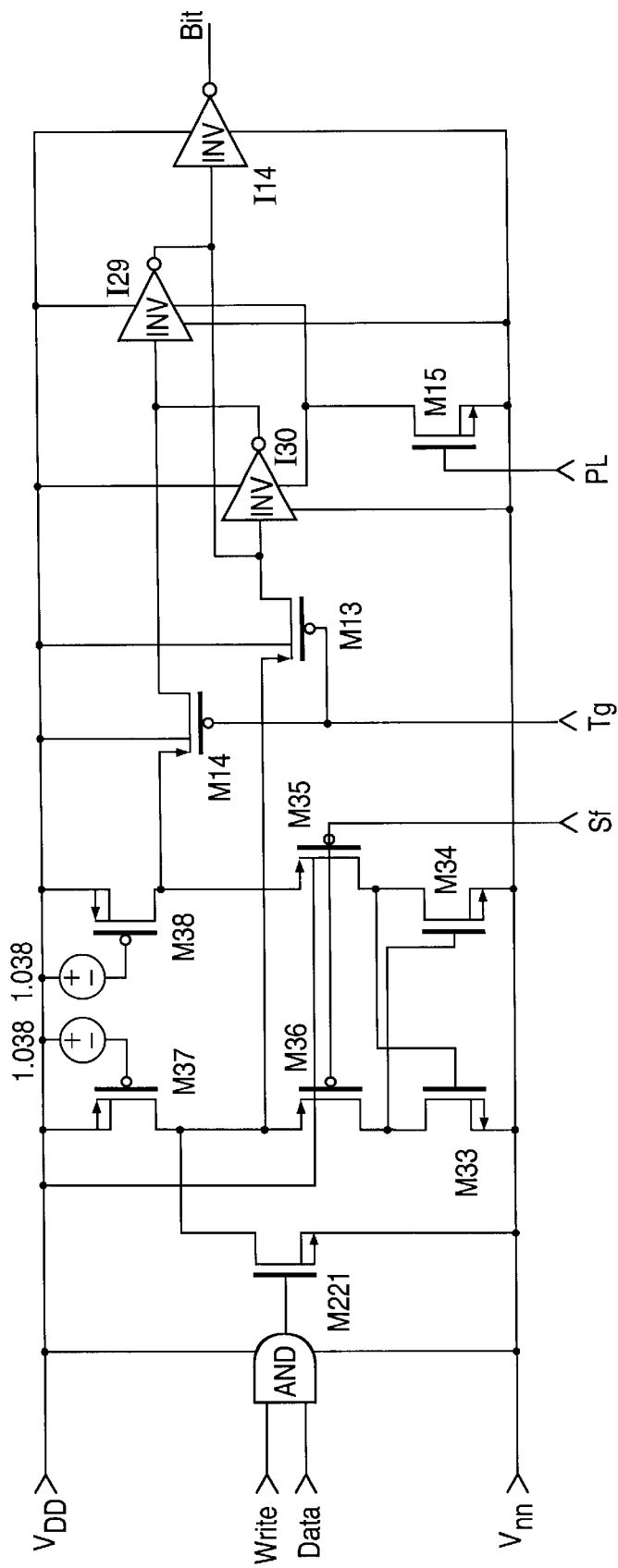
FIG. 3 is a schematic diagram illustrating the FIG. 1 circuit in a "untrimmed" state.

Referring to FIG. 3, for an un-trimmed PMOS EPROM circuit, the built-in offset caused by sizing NMOS latch device (M33) at W/L of 5×, while the value NMOS latch device (M34) NMOS is set at W/L of 1×, causes the drain of the latch transistor (M34) to rise to a voltage limited by Vds sat of PMOS devices (M35/M38). The output state at the drain of latch transistor (M33) will always default to low, unless the PMOS EPROM transistor (M37) was programmed.

Figure 4:
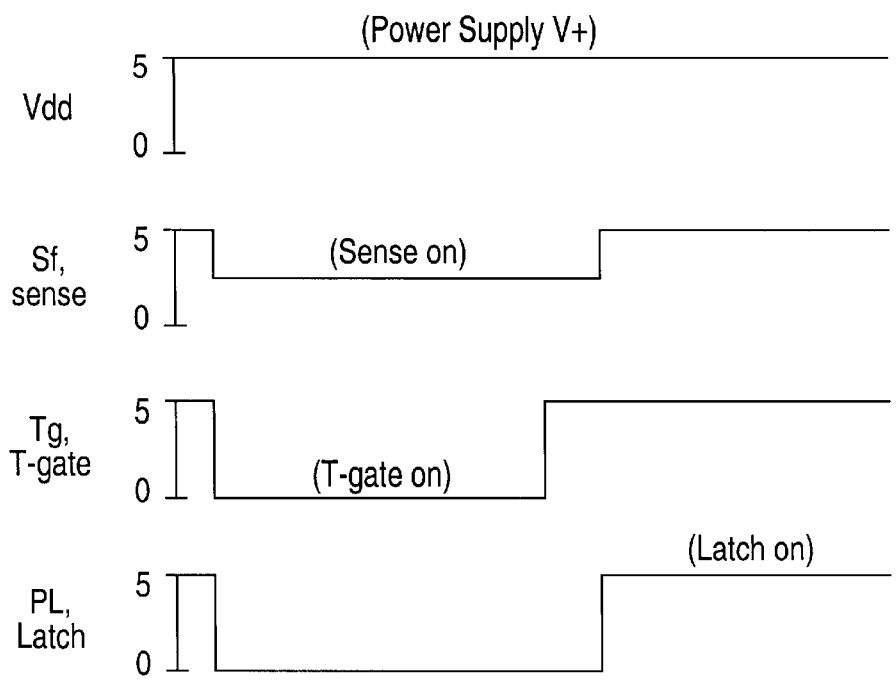
FIG. 4 is a timing diagram illustrating the transient response of the FIG. 1 circuit.

Referring to FIG. 4, the sequence of the trimmer signal Tg is as follows:

1.) Sf bias line is pulled from VDD to about a couple of volts below VDD.

2.) Tg goes low and turns the transmission gates (M13/14) on.

3.) PL goes high to set the latch inverters (I29/30).
4.) Tg goes high and turns transmission gates (M13/14) off.
5.) Sf bias line is pulled to VDD.
6.) The PL line stays high to hold the latch.
7.) The output is then buffered by the output inverter (I14).

Figure 5:
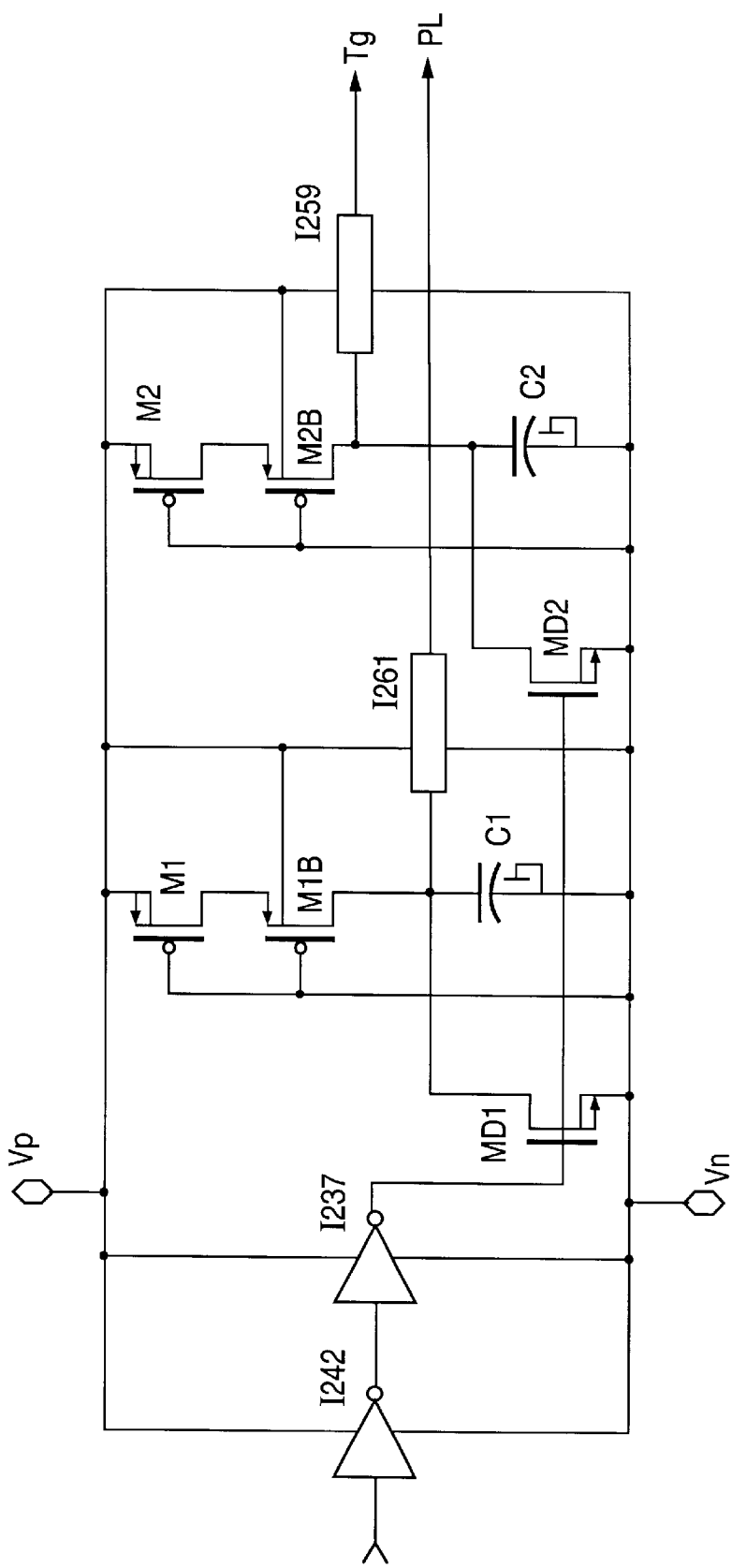
FIG. 5 is a schematic diagram illustrating an embodiment of a circuit utilizable for generating the trimmer signal (Tg) input and latch signal (LP) input to the FIG. 1 circuit.

As shown in FIG. 5, the Power-On-Reset (POR) sequence is initiated after the input POR signal edge goes low at the buffered input (I242). A simple RC delay circuit includes devices (M1/M1B) and capacitor (C1) and devices (M2/M2B) and capacitor (C2). The outputs are buffered by inverter chains (I259/I261).

Figure 6:
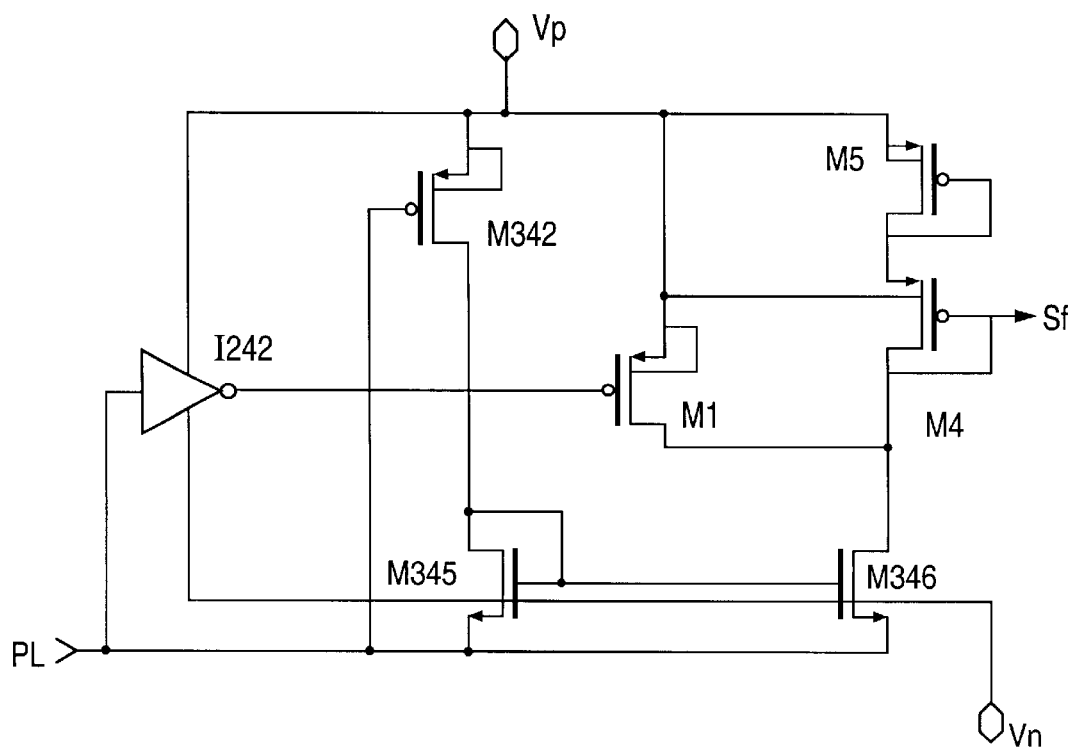
FIG. 6 is a schematic diagram illustrating an embodiment of a circuit utilizable for generating the replication bias voltage (Sf) input to the FIG. 1 circuit.

Referring to FIG. 6, the Sf replica bias circuit includes a simple resistor (M342), current mirror (M345/346) and replica Vgs of 'diode' connected PMOS transistors (M5/M4). The channel length of transistor (M5) matches, and is scaled to, the EPROM PMOS devices (M37/M38). The channel length of transistor (M4) matches, and is scaled to, the cascode PMOS devices (M35/M36). The output (Sf) is clamped to VDD transistor (M1) when the circuit is out of the 'read' POR mode (static mode).

It should be understood that various alternatives to the embodiments of the invention described above may be employed in practicing the invention. It is intended that the following claims define the scope of the invention and that methods and structures within the scope of these claims and their equivalents be covered thereby.

What is claimed is:

1. A trim bit circuit connected between a relatively positive voltage supply and a relatively negative voltage supply, the trim bit circuit comprising:
   a trimmed p-channel transistor having its source connected to the positive voltage supply and its gate electrically floating;
   an un-trimmed p-channel transistor having its source connected to the positive voltage supply and its gate electrically floating;
   first and second cascode p-channel transistors, the first cascode p-channel transistor having its source connected to the drain of the trimmed p-channel transistor and its gate connected to receive a replication bias voltage, the second cascode p-channel transistor having its source connected to the drain of the un-trimmed p-channel transistor and its gate connected to receive the replication bias voltage, both the body of the first cascode p-channel transistor and the body of the second cascode p-channel transistor being connected to the positive voltage supply;
   first and second n-channel latch transistors, the first n-channel latch transistor having its source connected to the negative voltage supply, its drain connected to the drain of the first cascode p-channel transistor and its gate connected to the drain of the second cascode p-channel transistor, the second n-channel latch transistor having its source connected to the negative voltage supply, its drain connected to the drain of the second cascode p-channel transistor and its gate connected to the drain of the first cascode p-channel transistor, both the body of the first n-channel latch transistor and the body of the second n-channel latch transistor being connected to the negative voltage supply;
   an n-channel current sink transistor having its source connected to the negative voltage supply, its drain connected to the drain of the trimmed p-channel transistor and its gate connected to receive an input data signal;
   first and second p-channel transmission gate transistors, the first transmission gate transistor having its source connected to the drain of the trimmed p-channel transistor and its gate connected to receive a trimming input signal, the second transmission gate transistor having its source connected to the drain of the un-trimmed p-channel transistor and its gate connected to receive the trimming input signal;
   first and second latch inverters, the first latch inverter having its input connected to the drain of the first transmission gate transistor and its input connected to the input of the second latch inverter, the second latch inverter having its input connected to the drain of the second transmission gate transistor and its output connected to the input of the first latch inverter
   an n-channel latch inverter set transistor having its gate connected to receive a latch inverter set input signal, its source connected to the negative supply voltage and its drain connected to a set input node of the first latch inverter and to a set input node of the second latch inverter; and
   an output buffer inverter having its input connected to the input of the first latch inverter and to the output of the second latch inverter, the output of the output buffer inverter providing a trim bit output signal.

2. A trim bit circuit connected between a relatively positive voltage supply and a relatively negative voltage supply, the trim bit comprising:
   a trimmed p-channel transistor having its source connected to the positive voltage supply and its gate electrically floating;
   an un-trimmed p-channel transistor having its source connected to the positive voltage supply and its gate electrically floating;
   first and second cascode p-channel transistors, the first cascode p-channel transistor having its source connected to the drain of the trimmed p-channel transistor and its gate connected to receive a replication bias voltage, the second cascode p-channel transistor having its source connected to the drain of the un-trimmed p-channel transistor and its gate connected to receive the replication bias voltage, both the body of the first cascode p-channel transistor and the body of the second cascode p-channel transistor being connected to the positive voltage supply;
   first and second n-channel latch transistors, the first n-channel latch transistor having its source connected to the negative voltage supply, its drain connected to the drain of first cascode p-channel transistor and its gate connected to the drain of the second cascode p-channel transistor, the second n-channel latch transistor having its source connected to the negative voltage supply, its drain connected to the drain of the second cascode p-channel transistor and its gate connected to the drain of the first cascode p-channel transistor, both the body of the first n-channel latch transistor and the body of the second n-channel latch transistor being connected to the negative voltage supply;
   an n-channel current sink transistor having its source connected to the negative voltage supply, its drain connected to the drain of the trimmed p-channel transistor and its gate connected to receive an input data signal; and
   a buffer responsive to a latch state for providing a trim output signal.

3. A trim bit circuit as in claim 2, and wherein the buffer includes:

first and second p-channel transmission, gate transistors, the first transmission gate transistor having its source connected to the drain of the trimmed p-channel transistor and its gate connected to receive a trimming input signal, the second transmission gate transistor having its source connected to the drain of the un-trimmed p-channel transistor and its gate connected to receive the trimming input signal.

4. A trim bit circuit as in claim 3, and wherein the buffer further includes:

first and second latch inverters, the first latch inverter having its input connected to the drain of the first transmission gate transistor and its input connected to the input of the second latch inverter, the second latch inverter having its input connected to the drain of the second transmission gate transistor and its output connected to the input of the first latch inverter.

5. A trim bit circuit as in claim 4, and wherein the buffer further includes:

an n-channel latch inverter set transistor having its gate connected to receive a latch inverter set input signal, its source connected to the negative supply voltage and its drain connected to a set input node of the first latch inverter and to a set input node of the second latch inverter.

6. A trim bit circuit as in claim 5, and wherein the buffer further includes:

an output buffer inverter having its input connected to the input of the first latch inverter and to the output of the second latch inverter, the output of the output buffer inverter providing a trim bit output signal.

\* \* \* \* \*